United States Patent [19]

Gillet et al.

[11] 4,200,864

[45] Apr. 29, 1980

[54] PROCESS CONTROL PLANT COMPRISING PROCESSING OF SIGNALS

[75] Inventors: Auguste Gillet; Paul Gilsoul, both of Mont-sur-Marchienne; Emile Malhaize, Marcinelle, all of Belgium

[73] Assignee: Ateliers de Constructions Electriques de Charleroi (ACEC), Charleroi, Belgium

[21] Appl. No.: 838,960

[22] Filed: Oct. 3, 1977

[30] Foreign Application Priority Data

Oct. 11, 1976 [BE] Belgium ................................. 847141

[51] Int. Cl.² ............................................. G21C 17/00
[52] U.S. Cl. .................................... 340/507; 340/501; 176/19 R; 176/24
[58] Field of Search ............... 340/500, 501, 506, 507, 340/584; 176/19 R, 19 EC, 20 R, 24, 25

[56] References Cited

U.S. PATENT DOCUMENTS 3,424,652   1/1969   Oehmann ........................ 176/19 R

OTHER PUBLICATIONS

"Nuclear Safety"; by Jacobs; vol. 6, No. 3, 1965; pp. 242-245.

"AEG Mitteilongen"; by Andrich et al., vol. 56, No. 2; 1966, pp. 149-151, Eliter-Verlag, Berlin.

Primary Examiner—Alvin H. Waring
Attorney, Agent, or Firm—Schwartz, Jeffery, Schwaab, Mack, Blumenthal & Koch

[57] ABSTRACT

A process control installation has means for sensing a plurality of physical conditions connected to means for comparing the condition to a reference. A differential signal is fed to a corresponding reproduction circuit which in turn feeds it to inputs of a plurality of majority decision circuits. The majority decision circuits are in turn connected to pairs of logic circuit trains which in turn are connected to other logic circuitry for intrinsic security.

7 Claims, 4 Drawing Figures

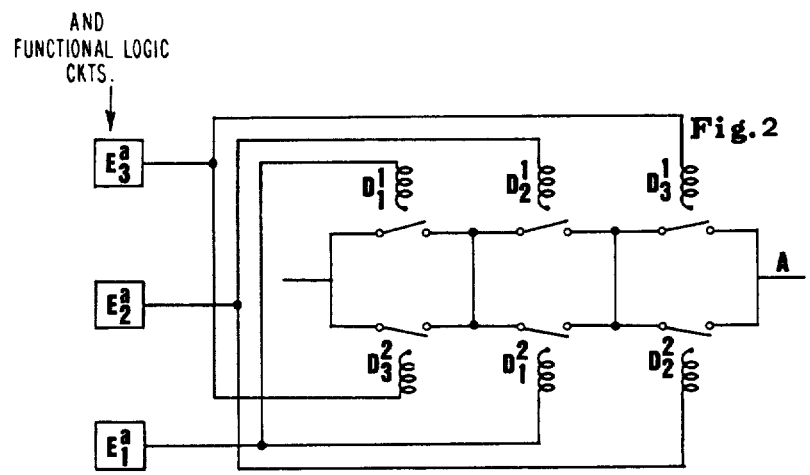
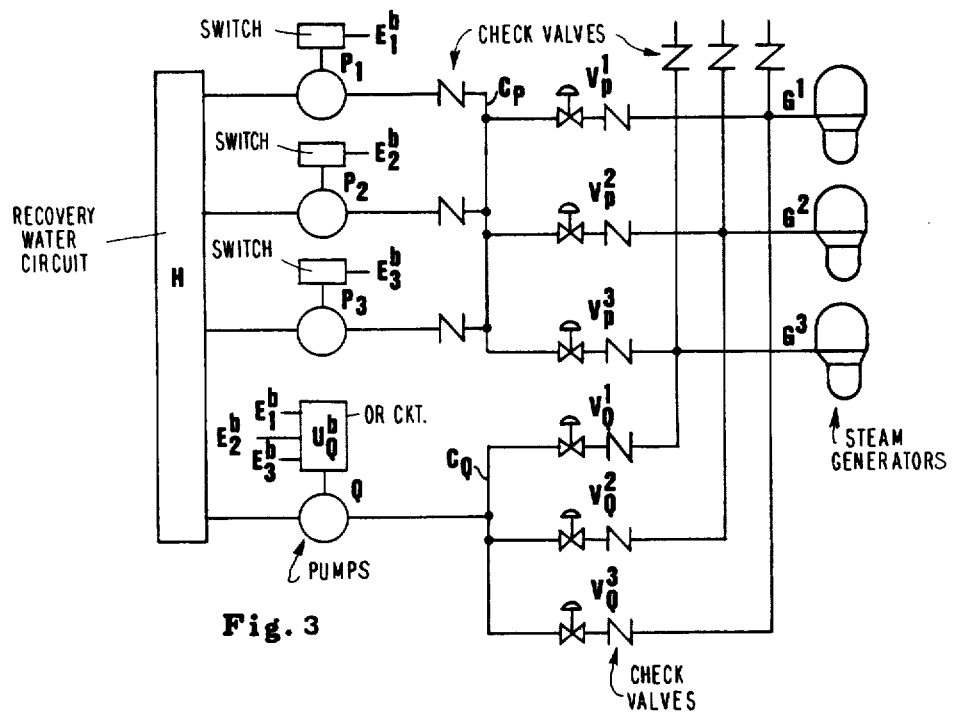

4,200,864

PROCESS CONTROL PLANT COMPRISING PROCESSING OF SIGNALS

BACKGROUND OF THE INVENTION

The instant invention relates to a process control installation for mechanical elements such as pumps, valves, pulleys, control rod release stops, etc. More particularly, the invention may be utilized especially for controls in nuclear power plants, but is in no way limited to this application.

It is known to utilize a process control installation for nuclear power plants in which a predetermined number of physical characteristics are detected or measured, each by several, (e.g., three independent sensors or probes), so that the measurement of each physical characteristic gives rise to a set of several (in this case three), measurement values.

This known installation comprises, first, comparator circuits, each connected to one of the sensors and a reference transmitter, and each delivering at its output a signal the value of which is the difference between the value of reference and the value measured by the probe. Secondly, the installation comprises circuits for the reproduction of signals of the same value as the input signal, galvanically separated one with respect to the other and with respect to the input signal. Each reproduction circuit is connected to the output of a comparator circuit. In the third place, majority decision circuits are provided, each one associated with a physical characteristic. These majority decision circuits are connected to an output of each of the reproduction circuits which in turn receive signals from the comparator circuits connected to the probes measuring or detecting the same physical characteristic. If each physical characteristic is measured by three independent probes each majority decision circuit comprises three inputs. It is further possible to provide "two of three" majority decision circuits the output of which is not dependent on a single breakdown, but is sensitive to a double or triple breakdown. In the fourth place, the installation comprises two identical functional logic flow circuits at one or several outputs of and connected to the output of a majority decision circuit. These logic circuit trains may be very complex and comprise a variety of outputs designed to activate the different mechanical elements of the process control. Thus, in the fifth place, functional logic sets or circuits, each one connected to two corresponding outputs of the two circuit logic trains and influencing, as needed across the power circuits, one or several mechanical process control elements.

It is useful at the point to briefly discuss the concept of the functional logic sets. This set is considered not in view of the output control signal, but in view of its final influence on the functioning of the process. For example, when the anticipated function is the opening of water valves in the event of a fire, if at least one of the logic circuit trains signal the beginning of a fire, a functional OR logic circuit can either open one valve by virtue of an electronic OR logic circuit, or an AND electronic logic circuit so that the signal to open the valve indicates the presence or absence of a fire. According to an alternative, the functional logic OR circuit can activate two valves disposed in parallel to open them, or open one of the two if one alone, or both, if the two logic circuit trains transmit the fire alarm.

The known control installation, described hereinabove is highly reliable in normal operation, however, not being equipped with circuits for intrinsic security, partially loses this quality when one or the other of the two logic circuit trains is tested. Logic circuits for intrinsic security are described, for example, in the French Pat. Nos. 1,410,561, 1,461,822, 1,515,044 and 1,520,105. Furthermore, as is generally the case, when one of the logic circuit trains breaks down, the condition of the output represents the intervention of an urgency measure, for example, the sprinkling in case of a fire. This sprinkling can be initiated by a breakdown of a logic circuit train and may lead to the unnecessarily soaking of a costly installation. The same inconvenience results during an unexpected halt of a chemical process necessitating thereafter the cleaning of the polymerization tunnels and a delicate start up.

SUMMARY

The principal aim of the invention is to increase the security of the installation as a result of the utilization of logic circuits for intrinsic security and also to avoid untimely interruptions due to the breakdown of a single train of logic circuits. A subsidiary aim is the maintenance of the standard of security and insensitivity to accidental errors of one single logic circuit train during testing periods.

The installation following the invention is characterized in that each of the identical logic circuit trains is replaced by two trains of identical logic circuits of which the corresponding outputs are connected to the functional AND logic circuit, the outputs of the AND logic circuit being connected to the input of an OR logic circuit. Preferably, all of the logic circuits are for intrinsic security. According to one subsidiary characteristic, a third set of two identical logic circuit trains is provided the corresponding outputs of which are connected to the functional AND logic circuits, the outputs of the AND logic functional circuits being connected to the inputs of a functional logic circuit, OR circuit, or majority decision circuit "two of three".

BRIEF DESCRIPTION OF DRAWINGS

The above and other objects of the invention will become more apparent from the following description and accompanying drawings wherein:

FIG. 2 shows a functional OR logic circuit, wired as a "two of three", majority decision circuit;

FIG. 3 represents a functional OR circuit or a relatively complex "one of three" majority decision circuit and FIG. 4 represents another functional OR.

DETAILED DESCRIPTION

Figure 1:
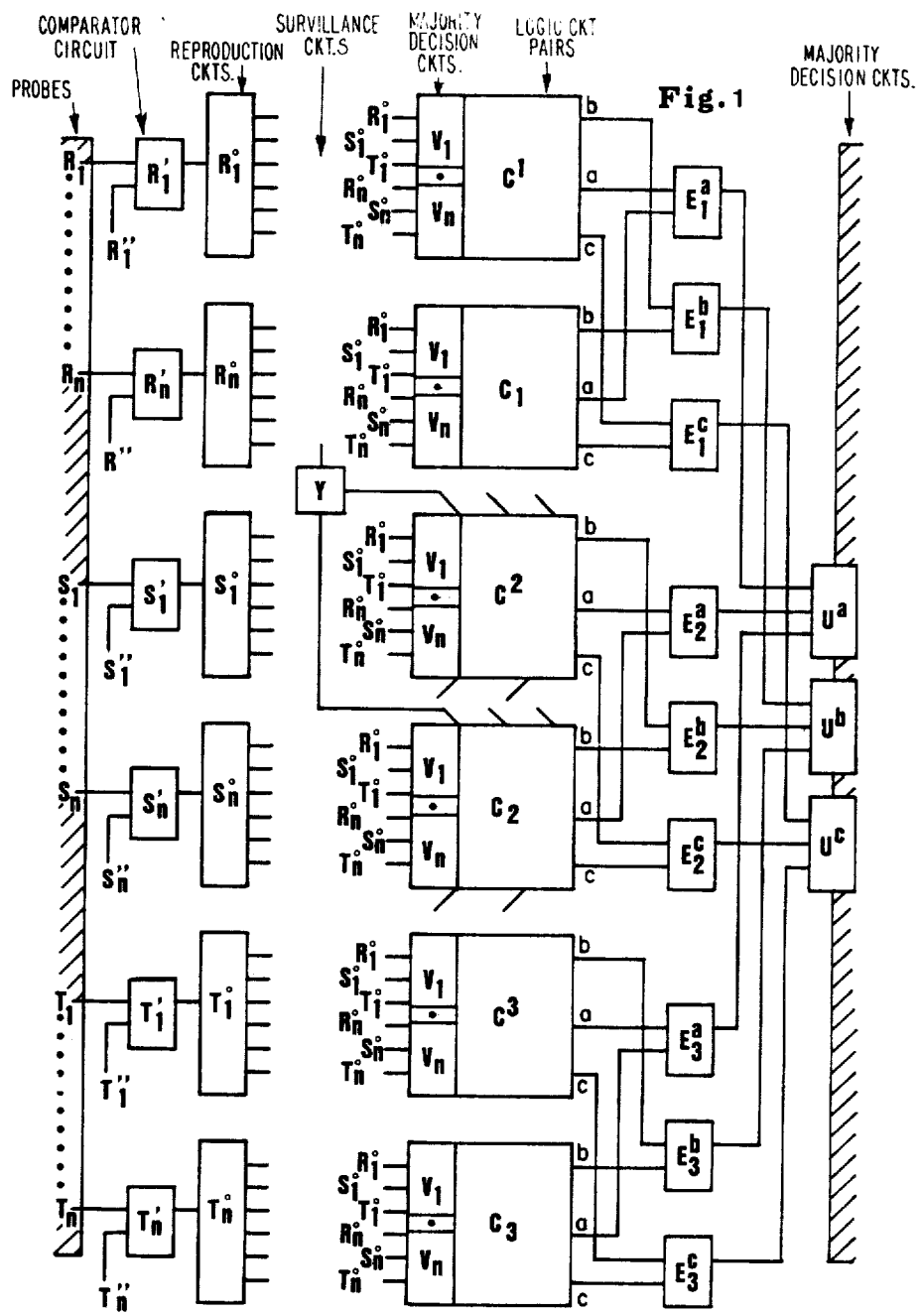
FIG. 1 of the drawing is a block schematic of an installation according to the invention.

In FIG. 1, an enclosure of a nuclear power plant encloses three sets of sensor probes $R_1 \ldots R_n$, $S_1 \ldots S_n$, $T_1 \ldots T_n$; the probes $R_1$, $S_1$ and $T_1$ each measure the same physical characteristics among a number of n physical characteristics. The output signal of each probe $R_1 \ldots T_n$ is brought across a conductor to a corresponding comparator circuit $R_1' \ldots T_n'$. A second input of each comparator circuit $R_1' \ldots T_n'$ is connected to a reference transmitter via a plurality of conductors $R_1'' \ldots T_n''$. The actual circuitry of the comparator circuit $R_1' \ldots T_n'$ is well known, as is its function. At the output of each circuit $R_1' \ldots T_n'$ appears a signal representing the difference between the value of the references and the value of the output signal of the probe to which it is connected.

Circuits for the reproduction of the signals of the same value as the input signal, galvanically separated one with respect to the other and with respect to the input signal, are designated by $R_1° \ldots T_n°$. Each reproduction circuit $R_1° S_1° T_1°$ is respectively connected to a corresponding probe $R_1 S_1 T_1$ measuring the physical characteristic "1" through a respective comparator circuit $R_1' S_1' T_1'$. An example of a reproduction circuit which may be used is described in the Belgian patent application No. 1/7598. However, if the value at the input of the reproduction circuit is a binary value, it is possible to choose a simple relay as a reproduction circuit. This further assumes that a relay is considered sufficiently reliable for the physical characteristic under consideration to be transmitted. Each reproduction circuit $R_1° \ldots T_1°$ comprises six outputs galvanically separated with respect to one another and to the input.

A plurality of majority decision circuits $V_1$ to $V_n$, each general index k having three inputs and an output, are connected in front of the inputs of six identical logic circuit trains $C^1$ to $C^3$ used for intrinsic security. The outputs indexed a, b, c of these circuits are for security, "a" representing, for example, triggering the alarm for the release of the rods; and b and c representing safeguard functions.

The majority decision circuits $V_1 \ldots V_n$ are each connected to the corresponding reproduction circuits $R_1° \ldots R_n°$, $S_1° \ldots S_n°$, $T_1° \ldots T_n°$ which in turn are connected to comparator circuit $R_1' \ldots R_n'$, $S_1' \ldots S_n'$, $T_1' \ldots T_n'$ and to the probes $R_1 \ldots R_n$, $S_1 \ldots S_n$, $T_1 \ldots T_n$, each probe of same index $1 \ldots n$ measuring the same physical characteristic "k" taken from $1 \ldots n$. These are the majority decision circuits which are "two of three" and which are well known in the regulation and automation art. They produce therefore an output signal corresponding to two identical input signals, one of the input signals capable of being different from the other two. As a result, the breakdown of one of the probes $R_1 \ldots R_n$, $S_1 \ldots S_n$, $T_1 \ldots T_n$ or of its associated comparator circuit $R_1' \ldots R_n'$, $S_1' \ldots S_n'$, $T_1' \ldots T_n'$ or of the associated reproduction circuit $R_1° \ldots R_n°$, $S_1° \ldots S_n°$, $T_1° \ldots T_n°$ does not modify the input signal to the logic circuit trains C. The six trains $C^1$, $C_1$, $C^2$, $C_2$, $C^3$, $C_3$ are assembled in three pairs by means of nine AND functional logic circuits. Each pair $C^1$, $C_1$; $C^2$, $C_2$; $C^3$, $C_3$ is associated with three AND functional logic circuits $E_1^a$, $E_1^b$, $E_1^c$; $E_2^a$, $E_2^b$, $E_2^c$; $E_3^a$, $E_3^b$, $E_3^c$ by means of three different outputs. In their turn, the outputs of the groups $E_1^a$, $E_2^a$, $E_3^a$; $E_1^b$, $E_2^b$, $E_3^b$; $E_1^c$, $E_2^c$, $E_3^c$ are connected to the inputs of the functional OR logic circuits or "two of three" majority decision circuits respectively $U^a$, $U^b$, $U^c$. The $U^a$ group can, for example, control a retention system for control rods, permitting, upon receipt of an emergency signal, release of the control rods such that they fall freely into the reactor acting as stop rods. In this case, the output signals of the groups $E^a$, or $E_1^a$, $E_2^a$, $E_3^a$ (FIG. 2) represent the state of the emergency alert signals. To prevent that a fault in one of the circuits $E_1^a$, $E_2^a$, $E_3^a$ sets off the emergency signal, $U^a$ can be a "two of three" majority decision circuit, in this situation by means of three pairs of circuit breakers in parallel. Placed in series with the windings $D_1^1$, $D_1^2$, $D_2^1$, $D_2^2$, $D_3^1$, $D_3^2$ which have a minimum voltage are output signals of the circuits $E_1^a$, $E_2^a$, $E_3^a$. Each circuit breaker of one pair in parallel comprises a winding fed by a different signal than that feeding the winding of the other circuit breakers of the pair in parallel. For example: $D_1^1$, $D_3^2$; $D_2^1$, $D_1^2$; $D_3^1$, $D_2^2$. In this way, an interruption of the current in a conductor A in circuit with the three pairs of circuit breakers cannot take place in the case where at least two of the three signals $E_1^a$, $E_2^a$, $E_3^a$ transmit the emergency signal. In effect, if only $E_1^a$ transmits the emergency signal, the maintenance current in the conductor A circulates via $D_3^2 D_2^2 D_3^1$. If $E_2^a$ transmits the emergency signal, the current circulates via $D_3^2 D_1^2 D_3^1$. If $E_3^a$ transmits the emergency signal, the current circulates via $D_1^1 D_2^1 D_2^2$. For the current to be cut, it is necessary that two of the groups $E_1^a$, $E_2^a$, $E_3^a$ transmit the emergency signal. $U^a$ is thus "two of three" functional majority decision circuit.

The circuit $U^b$ can, for example, control the introduction of emergency feed water into a stream generator in case of a loss of normal feed water. This feed water removes the thermal power produced in the reactor. In case of emergency, the signals of the output of the devices $E_1^b$, $E_2^b$, $E_3^b$ activate, on the one hand, (FIG. 3) an emergency pumps $P_1$, $P_2$, $P_3$ disposed in parallel pipes in series with check valves Z, feeding a common conduit $C_P$ from a recovery water circuit H to the condenser. From this Conduit $C_P$ pipes emanate to manually remote-controlled valves $V_P^1$, $V_P^2$, $V_P^3$. These valves are connected to check valves Z of the type which can be maintained open. The output signals of the devices $E_1^b$, $E_2^b$, $E_3^b$ are applied on the other hand to a functional OR sub-circuit $U_Q^b$ activating a turbopump Q when any one of the devices $E_1^b$, $E_2^b$, $E_3^b$ transmits an alarm. The turbo-pump Q feeds water from the recovery circuit H to the condenser via a common conduit $C_Q$ which connects pipes through the manually remote-controlled valves $V_Q^1$, $V_Q^2$, $V_Q^3$ followed equally by check valves Z. The valves $V_Q^1$, $V_Q^2$, $V_Q^3$ can thus equally remain normally open. The valves $V_P^1$, $V_Q^1$; $V_P^2$, $V_Q^2$; $V_P^3$, $V_Q^3$ feed in parallel, respectively, three steam generators $G^1$, $G^2$, $G^3$. The circuit $U^b$ is thus in fact a functional OR hydraulic circuit for the emergency feeding of feed water of each generator $G^1$, $G^2$, $G^3$.

The circuit $U_c$ can, for example, control a system of boric acid release in the reactor in the event of an uncontrollable accident in releasing the control bars. One such system (FIG. 4) comprises a high pressure circuit having an injection reservoir I and a group of injection pumps $F_1$, $F_2$, $F_3$, as well as a low pressure circuit comprising an expansion reservoir J and circulation pumps $K_1$, $K_2$, $K_3$. Pneumatic valves $W_1$, $W_2$, $W_3$ make it possible to cut communication between the high pressure circuit and the low pressure circuit. Motor-operated, remote-controlled valves $X_1$, $X_2$, $X_3$ make it possible to establish communication between the reactor and the high pressure circuit. In normal operation, the injection pumps $F_1$, $F_2$, $F_3$ are stopped and the motor-operated valves $X_1$, $X_2$, $X_3$ are closed and isolate the high pressure circuit with respect to the reactor. The pneumatic valves $W_1$, $W_2$, $W_3$ are open. One of the circulation pumps $K_1$ operates and maintains the boric acid in movement through the low and high pressure circuits forcing it to pass through a heating apparatus M to avoid the local crystal precipitation of boric acid at cooler locations.

Figure 4:
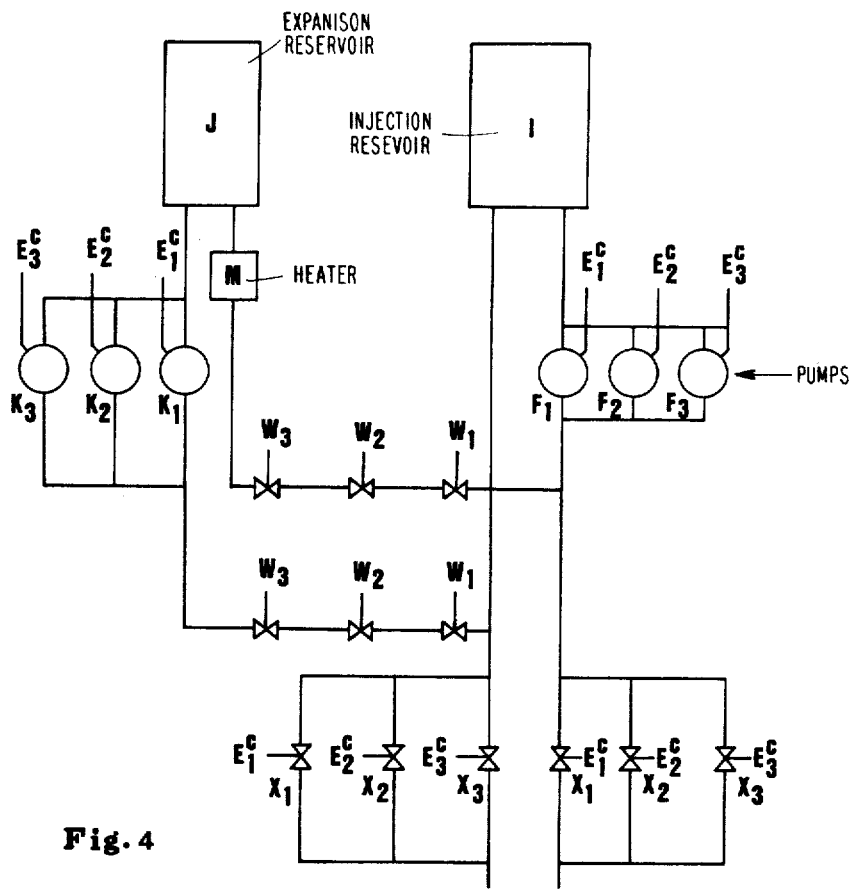

The functional logics $E_1^c$, $E_2^c$, $E_3^c$ circuits transmit alarm signals of "borification" which result in: the closing of the corresponding pneumatic valves $W_1$, $W_2$, $W_3$; the stopping of the circulation pumps $K_1$, $K_2$, $K_3$, isolating the low pressure circuit from the high pressure circuit. Simultaneously, the output signals of the circuits $E_1{}^c$, $E_2{}^c$, $E_3{}^c$ start the injection pumps $F_1$, $F_2$, $F_3$ and open the motorized valves $X_1$, $X_2$, $X_3$. At this moment, 12% boric acid is injected into the reactor which suppresses the neutron flux. The group $U^c$ shown in FIG. 4 is in fact an OR functional circuit. It is obviously possible to conceive of other variations of this $U^c$ group, for example, to use only two outputs (for example, the circuits $E_1{}^c$ and $E_2{}^c$) keeping in reserve the third ($E_3{}^c$) for substituting it for one or other of $E_1{}^c$ or $E_2{}^c$ during the tests. In this latter case, triple redundancy is reduced to double redundancy.

The installation according to the invention has a very high security due to the fact that each control is at least duplicated. It has the advantage of avoiding the untimely emergency stops due to a defect in the logic circuit train because these trains are duplicated for each command chain and connected by functional AND logic circuits. As these logic circuit trains can be very complex, conformity surveillance circuits Y can be provided between corresponding points of the two trains connected by an AND circuit. The Y circuits can activate for example, indicators on a surveillance board. In FIG. 1, a conformity surveillance circuit Y is represented which compares the outputs of the selector circuits $V_1$ associated with the logic circuit trains $C^2$ and $C_2$. Other Y circuits can be associated with other characteristic points corresponding to the circuits $C^2$ and $C_2$ as symbolically shown by the oblique lines. In reality, such Y circuits are associated to each pair of logic circuit trains $C^1$, $C_1$; $C^2$, $C_2$, $C^3$, $C_3$. All of the Y circuits associated with a pair of logic circuit trains can additionally be connected between themselves in a manner known in and of itself by a general security control device signalling the absence of conformity in any one of the Y circuits associated with the pair of logic circuit trains in question. The general control device can, for example, constitute a circuit according to French Pat. No. 1,466,050 to the inputs of which are connected the outputs of all of the Y circuits associated with the same pair of logic circuit trains.

It is possible to test the installation without endangering either normal operation, or its security nor even its availability in case of simple failure. In effect, as each physical characteristic is measured by three different sensors, a defect in one sensor or one of the elements $R_1' \ldots R_n'$, $S_1' \ldots S_n'$, $T_1' \ldots T_n'$ or $R_1{}^\bullet \ldots R_n{}^\bullet$, $S_1{}^\bullet \ldots S_n{}^\bullet$, $T_1{}^\bullet \ldots T_n{}^\bullet$ can be detected by the comparison of the corresponding inputs $R_1{}^\bullet \ldots R_n{}^\bullet$, $S_1{}^\bullet \ldots S_n{}^\bullet$, $T_1{}^\bullet \ldots T_n{}^\bullet$ of any one of the six logic circuit trains $C^1$ to $C_3$. Further, each of the six logic circuit trains $C^1$ to $C_3$ can be individually tested while at the same time permitting the normal operation of the five remaining circuits. As the test of a single logic circuit train $C^1$ to $C_3$ necessitates several hours, this safeguard requirement of the security and of the availability of the installation is hardly superfluous. In order to take into account also defects in one or the other electric feed systems the logic circuit trains of the same pair can be attached to different feeds. In this case, the AND logic functional circuit terminals of this pair can transmit the alarm by the absence of electric signal, that is to say when the two feeds break down. On the contrary, if the identical circuit logic trains of the same pair are fed by the same source of electric current, the alarm is transmitted only by the presence of an electric signal. In a general manner, as the control installation of a nuclear power plant comprises normally four feed systems, one can provide either on the one hand pairs of logic circuit trains in which the two trains are fed by the same source of current but a feed by sources of different currents for the pairs of the different logic circuit trains, or by pairs of logic circuit trains in which each train is fed by a source of different current. Under the conditions described hereinabove, and if the OR functional circuits are "two of three" majority decision circuits, the process control installation activates an emergency control only if simultaneously two of three feed systems used break down. It is apparent that in each case one uses, among the electric feed systems available, the three most reliable.

While the invention has been described, it will be understood that it is capable of further modifications and this application is intended to cover any modifications, uses or adaptations of the invention following in general the principles of the invention and including such departures from the present disclosure as come within known or customary practice in the art to which the invention pertains, and as may be applied to the essential features hereinbefore set forth and as fall within the scope of the invention or limits of the appended claims.

We claim:

1. A process control installation for mechanical elements in which a determined number of physical characteristics are to be detected or measured, each by several independent probes, comprising:
   (a) a plurality of comparator circuits including:
      (1) means for receiving a signal from a sensor,
      (2) means for receiving a reference signal, and
      (3) means for outputting a signal representative of the difference of said sensor signal and said reference signal;
   (b) a plurality of reproduction circuits connected to the output of a corresponding comparator circuit;
   (c) a plurality of majority decision circuits, each one associated with one of the physical characteristics and each connected to one of the outputs of all said reproduction circuits;
   (d) at least two pairs of identical functional logic circuit trains connected to the output of said majority decision circuits;
   (e) a plurality of functional OR logic groups each one connected to outputs from each of the corresponding logic circuit trains and influencing at least one mechanical process control element; and
   (f) each of said pair of identical logic circuit trains having corresponding outputs connected to functional AND logic circuits, the outputs of the functional AND logic circuits being connected to the inputs of said functional OR logic circuits.

2. An installation according to claim 1, including a third pair of trains of logic circuits whose corresponding outputs are connected to the functional AND logic circuit.

3. An installation according to claim 1, including a plurality of conformity surveillance circuits having two inputs connected to corresponding points in the identical logic circuit trains of a pair, said conformity surveillance circuits including means for activating signalling devices.

4. An installation according to claim 3, wherein all of said conformity surveillance circuits being associated with a pair of identical logic circuit trains and being connected to a general control device, signalling any disagreement between the different conformity surveillance circuits.

5. An installation according to claim 1 wherein said identical logic circuit trains of the same pair are fed by two sources of independent electric current, and the pairs of identical logic circuit trains being fed each one by two different sources chosen among three available sources and in that the AND logic functional circuit terminals of each pair include means for transmitting an alert by the absence of an electric signal.

6. An installation according to claim 1, wherein the two identical logic circuit trains of each pair are fed by the same source of electric current, as the pairs of idependent trains of logic circuits are fed each one by a different source chosen among three available sources and that the AND functional logic circuit terminals of each pair include means for transmitting an alert by the presence of an electric signal.

7. An installation according to claim 1, wherein all said logic circuits are for intrinsic security.

* * * * *